United States Patent
Koenig et al.

(10) Patent No.: US 10,168,351 B2
(45) Date of Patent: Jan. 1, 2019

(54) ACCELERATION SENSOR HAVING SPRING FORCE COMPENSATION

(71) Applicant: NORTHROP GRUMMAN LITEF GMBH, Freiburg (DE)

(72) Inventors: Stefan Koenig, Staufen (DE); Peter Leinfelder, Ehrenkirchen (DE)

(73) Assignee: Northrop Grumman LITEF GmbH (DE)

( * ) Notice: Subject to any disclaimer, the term of this patent is extended or adjusted under 35 U.S.C. 154(b) by 0 days.

(21) Appl. No.: 15/547,312

(22) PCT Filed: Jan. 27, 2016

(86) PCT No.: PCT/EP2016/051693
§ 371 (c)(1),
(2) Date: Jul. 28, 2017

(87) PCT Pub. No.: WO2016/120319
PCT Pub. Date: Aug. 4, 2016

(65) Prior Publication Data
US 2018/0024160 A1   Jan. 25, 2018

(30) Foreign Application Priority Data
Jan. 29, 2015 (DE) ................. 10 2015 001 128

(51) Int. Cl.
*G01P 15/125* (2006.01)
*G01P 15/13* (2006.01)
(Continued)

(52) U.S. Cl.
CPC .......... *G01P 15/125* (2013.01); *B81B 3/0054* (2013.01); *B81B 3/0059* (2013.01);
(Continued)

(58) Field of Classification Search
CPC ...... G01P 15/125; G01P 15/18; G01P 15/082; G01P 15/131; G01P 15/097
See application file for complete search history.

(56) References Cited

U.S. PATENT DOCUMENTS 5,511,420 A * 4/1996 Zhao ................ G01P 15/125
                                                73/514.18
5,565,625 A * 10/1996 Howe ................ G01L 1/148
                                                73/514.16
(Continued)

FOREIGN PATENT DOCUMENTS

CN        1753832 A      3/2006
CN      101819215 A      9/2010
(Continued)

OTHER PUBLICATIONS

International Search Report for Application No. PCT/EP2016/051693 dated Jun. 3, 2016.
(Continued)

*Primary Examiner* — Helen C Kwok
(74) *Attorney, Agent, or Firm* — Tarolli, Sundheim, Covell & Tummino LLP (57) ABSTRACT

The invention relates to an acceleration sensor (100) having a sensor material (120) which is mounted by means of spring elements (130) so as to be movable along a movement axis (x) over a substrate (110), first trim electrodes (140) which are connected to the sensor material (120), and second trim electrodes (150) which are connected to the substrate (110) and are associated with the first trim electrodes (140). When the sensor material is deflected along the movement axis, a spring force acting on the sensor material (120) is generated by the spring elements (130), and when the sensor material (120) is deflected, an electrostatic force acting on the sensor material (120), which counteracts the spring force, is gen-
(Continued)

erated by application of an electrical trim voltage between the first trim electrodes (140) and the second trim elements (150).

10 Claims, 6 Drawing Sheets

(51) Int. Cl.
*B81B 3/00* (2006.01)
*G01P 15/08* (2006.01)

(52) U.S. Cl.
CPC .... *G01P 15/131* (2013.01); *B81B 2201/0235* (2013.01); *B81B 2203/0163* (2013.01); *B81B 2203/04* (2013.01); *B81B 2203/051* (2013.01); *G01P 2015/0814* (2013.01); *G01P 2015/0862* (2013.01); *G01P 2015/0882* (2013.01)

(56) References Cited

U.S. PATENT DOCUMENTS

| | | | | |
|---|---|---|---|---|
| 5,610,335 A * | 3/1997 | Shaw | ................ | B81B 3/0051 |
| | | | | 73/514.36 |
| 5,780,740 A * | 7/1998 | Lee | ................ | B06B 1/0292 |
| | | | | 331/156 |
| 5,914,553 A * | 6/1999 | Adams | ................ | G01P 1/006 |
| | | | | 310/309 |
| 6,276,207 B1 * | 8/2001 | Sakai | ................ | B81B 3/0008 |
| | | | | 73/514.16 |
| 6,745,627 B1 * | 6/2004 | Woodruff | ............ | G01P 15/0802 |
| | | | | 73/514.29 |
| 2001/0004846 A1 * | 6/2001 | Kawai | ................ | G01C 19/5719 |
| | | | | 73/504.02 |
| 2001/0025530 A1 * | 10/2001 | Sakai | ................ | B81B 3/0008 |
| | | | | 73/514.32 |
| 2002/0011112 A1 * | 1/2002 | Kipp | ................ | B81B 3/0008 |
| | | | | 73/579 |
| 2003/0183008 A1 * | 10/2003 | Bang | ................ | B81C 1/0019 |
| | | | | 73/514.01 |
| 2005/0001275 A1 * | 1/2005 | Sugiura | ............... | G01P 15/0802 |
| | | | | 257/414 |
| 2005/0039530 A1 * | 2/2005 | Schellin | ............... | B81C 99/006 |
| | | | | 73/514.32 |
| 2005/0056094 A1 * | 3/2005 | Geen | ................ | G01C 19/5719 |
| | | | | 73/504.14 |
| 2006/0112765 A1 * | 6/2006 | Malvern | ................ | G01P 1/006 |
| | | | | 73/514.32 |
| 2010/0050771 A1 * | 3/2010 | Je | ................ | G01P 15/0802 |
| | | | | 73/514.32 |
| 2011/0100126 A1 | 5/2011 | Jeong et al. | | |
| 2011/0219875 A1 * | 9/2011 | Walther | ................ | B81B 3/0051 |
| | | | | 73/514.29 |
| 2013/0319076 A1 * | 12/2013 | Moreau | ............... | B81C 1/00968 |
| | | | | 73/1.38 |
| 2014/0096587 A1 * | 4/2014 | Stewart | ................ | G01P 15/125 |
| | | | | 73/1.38 |
| 2014/0165691 A1 | 6/2014 | Stewart | | |
| 2015/0096377 A1 * | 4/2015 | Membretti | ............ | G01P 15/125 |
| | | | | 73/514.32 |
| 2015/0143905 A1 * | 5/2015 | Kuisma | ................ | B81B 7/008 |
| | | | | 73/504.12 |
| 2016/0252544 A1 * | 9/2016 | Malvern | ............... | G01P 15/125 |
| | | | | 73/514.32 |
| 2016/0334439 A1 * | 11/2016 | Malvern | ................ | B81B 5/00 |
| 2017/0297908 A1 * | 10/2017 | Almeida Loya | .......... | B81B 7/02 |

FOREIGN PATENT DOCUMENTS

| | | |
|---|---|---|
| DE | 19642893 A1 | 4/1997 |
| DE | 69432074 T2 | 6/2003 |
| DE | 10 2009 046807 A1 | 5/2011 |
| DE | 10 2013 007 593 A1 | 11/2014 |
| DE | 10 2013 208 688 A1 | 11/2014 |
| DE | 102015001128 A1 | 1/2015 |
| WO | 94/28427 A1 | 12/1994 |
| WO | 1994028427 | 12/1994 |
| WO | 97/44675 A1 | 11/1997 |
| WO | 1997044675 | 11/1997 |
| WO | 2004/076340 A1 | 9/2004 |
| WO | 2014184033 A1 | 11/2014 |
| WO | 2015/052487 A1 | 4/2015 |

OTHER PUBLICATIONS

Search Report corresponding to Chinese Patent Application No. 201680006360, dated Mar. 9, 2018, pp. 1-2.
European Decision to Grant corresponding to European Application No. 16701776.3, dated Jun. 13, 2018.

* cited by examiner

ACCELERATION SENSOR HAVING SPRING FORCE COMPENSATION

RELATED APPLICATIONS

The present invention is a U.S. National Stage under 35 USC 371 patent application, claiming priority to Serial No. PCT/EP2016/051693, filed on 27 Jan. 2016; which claims priority of DE 10 2015 001 128.6, filed on 29 Jan. 2015, the entirety of both of which are incorporated herein by reference.

The invention relates to an acceleration sensor having spring force compensation.

Acceleration sensors for the measurement of accelerations are used in various applications. In this process, a mass component is often mounted by means of spring elements over a substrate, the deflection of which is measured in the case of acceleration present. To increase the susceptibility and thus sensitivity to accelerations, it is desirable to keep the spring stiffness of the springs as low as possible, without changing other characteristics such as shock resistance or susceptibility to lateral accelerations. However, a reduction is limited by the manufacturing technologies used and usually already exhausted.

WO 94/28427 A1 describes a micro-electro-mechanical acceleration sensor with a mobile test mass supported by springs which have a controllable spring hardness.

US 2005/0001275 A1 describes an acceleration sensor having a test mass held by springs, wherein the spring hardness of the springs can be adjusted by means of electrodes.

WO 97/44675 A1 describes a vibratory transducer in which vibrations can be excited by means of electrodes arranged on both sides of a vibrating beam.

The invention is based on the object to provide an acceleration sensor having low effective spring stiffness or spring hardness.

The object is solved by the subject matter of the independent claims. Further developments are defined by the dependent claims.

An acceleration sensor has: a sensor material which is mounted by means of spring elements so as to be movable along a movement axis over a substrate; first trim electrodes which are connected to the sensor material; and second trim electrodes which are connected to the substrate and are associated with the first trim electrodes. When the sensor material is deflected along the movement axis, a spring force acting on the sensor material is generated by the spring elements, and when the sensor material is deflected, an electrostatic force acting on the sensor material, which counteracts the spring force, is generated by application of an electrical trim voltage between the first trim electrodes and the second trim electrodes.

Due to the electrical trim voltage between the first and the second trim electrodes, both a spring force acting on the sensor material and an electrostatic force, which counteracts the spring force, is generated when the sensor material is deflected. Since the counteracting electrostatic force is always generated when the spring force is also generated, a compensation of the two forces occurs, whereby the effective spring constant of the system which is composed of the spring constant of the spring elements and of the spring constant of the trim electrode pairs, can be freely adjusted by setting the trim voltage.

Without trim voltage, the spring force generated by the spring elements drives back the sensor material contrary to the direction of deflection. Due to the electrical trim voltage, the back-driving force is decreased and can, for example, be fully reduced. This corresponds to a system where the sensor material is connected via spring elements without spring stiffness to the substrate.

An increase of the electrical trim voltage beyond complete compensation leads to a system with a negative spring constant, i.e. a system which, when the sensor material is deflected, does no longer return into the rest position, but is further deflected in the direction of deflection. Hence, it is possible to arbitrarily adjust the spring stiffness of the substrate-spring element-sensor material system by applying an electrical trim voltage between the trim electrode pairs.

The acceleration sensor can have sensor electrodes which are connected to the sensor material, and detection electrodes which are connected to the substrate and are associated with the sensor electrodes. A deflection of the sensor material along the movement axis can be determined through a change of an electrical detection voltage between or of an electrical charge on the sensor electrodes and the associated detection electrodes. Thus, it is possible to drive the acceleration sensor with freely adjustable spring hardness and read out an acceleration measured by the acceleration sensor.

A part of the sensor electrodes can be formed as first trim electrodes, and the trim voltage between the sensor electrodes formed as first trim electrodes and the second trim electrodes can dampen the deflection of the sensor material. Thus, it is possible to assign a plurality of tasks to a part of the electrodes of the acceleration sensor, whereby the acceleration sensor can be formed more compactly. By using a part of the sensor electrodes as first trim electrodes it can be avoided to mount additional first trim electrodes on the sensor material.

The first trim electrodes can be mounted symmetrically to an axis of symmetry perpendicular to the movement axis on the sensor material, and the second trim electrodes can be mounted symmetrically to the axis of symmetry perpendicular to the movement axis on the substrate. Due to such a completely symmetrically designed arrangement of the trim electrodes, no resulting force acting on the trim electrodes can emerge, as long as the sensor material is not deflected. Thus, it is ensured that the presence of the first and of the second trim electrodes does not distort the reading out of the acceleration sensor, but only serves for free adjustability of the spring hardness of the acceleration sensor. In addition, the effect of manufacturing tolerances can be reduced by such an arrangement.

The electrostatic force generated by the first trim electrodes and the second trim electrodes can be equal to the spring force generated by the spring elements. Thus, it is ensured that even when the sensor material is deflected, no force acts effectively on the sensor material, which drives it back into the starting position. Thus, the sensor material can be freely positioned with reference to possibly existing excitation and detection electrodes. This allows the reduction or full prevention of distortions in the measurement behavior caused by manufacturing tolerances (bias).

A part of the first trim electrodes can be formed as comb electrodes, and the second trim electrodes can be formed as electrode plates. The part of the trim electrodes formed as comb electrodes, the electrode finger bearing the comb electrodes, and the second trim electrodes then form a plate capacitor serving to generate the electrostatic force. Due to such an arrangement it is possible to use the first trim electrodes, in addition to generating the electrostatic force counteracting the spring force, also for further purposes such as the detection of acceleration. Thus, it is possible to design the acceleration sensor more compactly.

A part of the first trim electrodes can be formed as electrode plates, and the first trim electrodes which are formed as electrode plates can, together with the associated second trim electrodes, form plate capacitors. This allows the manufacture of the first trim electrodes and the second trim electrodes in a simple manner, whereby acceleration sensors, the spring hardness of which is freely adjustable, can be manufactured in a simple and cost-efficient manner.

The sensor material can be kept in a neutral position through setting of the detection voltage, in which the acceleration measured is independent of the trim voltage. The actually present acceleration is irrelevant. Thus, it is ensured that, irrespective of the applied trim voltage, a specific acceleration is measured by the sensor material. This acceleration can be determined via the detection and sensor electrodes and form, together with the neutral position, a parameter pair which is characteristic of the acceleration sensor used. For example, it can be determined from the parameter pair consisting of neutral position and associated acceleration, whether the position or form of the trim electrodes is stable, or whether the acceleration sensor is damaged. Thus, the reliability of the acceleration sensor can be increased.

From the neutral position, a computing unit can determine a deviation of a first position of the sensor material, in which no spring force acts on the sensor material, from a second position of the sensor material, in which no force generated by the sensor electrodes and detection electrodes acts on the sensor material. Thus, it is possible to determine—through determination of the neutral position—whether deviations of the mechanical zero point (i.e. position of the sensor material without spring force) and of the electrical zero point (i.e. position of the sensor material without any force resulting from sensor electrodes and detection electrodes) caused by manufacturing tolerances cause a distortion (bias) of the acceleration measurement with the acceleration sensor. Thus, the reliability of the acceleration sensor is increased.

A computing unit can, based on changes of the neutral position and changes of the trim voltage required to cancel the spring force, check the acceleration sensor for errors. Thus, the reliability of the acceleration sensor is increased.

The acceleration sensor can be a micro-electro-mechanical system (MEMS). Thus, it is possible to use the advantages explained above also in micro-electro-mechanical systems for acceleration measurement.

These and additional advantages and features of the invention will be explained in more detail in the following text based on examples with the aid of the accompanying figures, in which

Figure 1A:
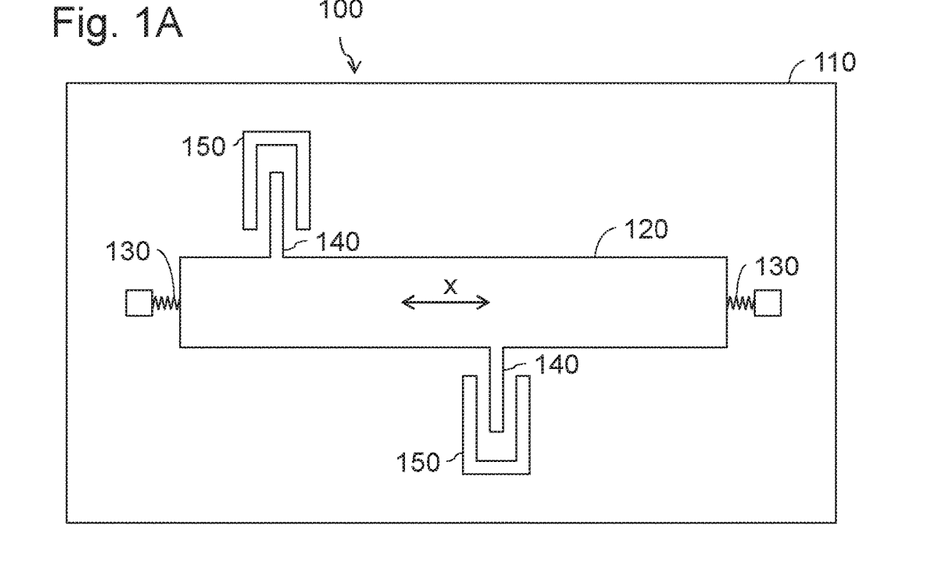
FIGS. 1A and 1B show schematic representations of an acceleration sensor according to an embodiment.
Figure 1B:
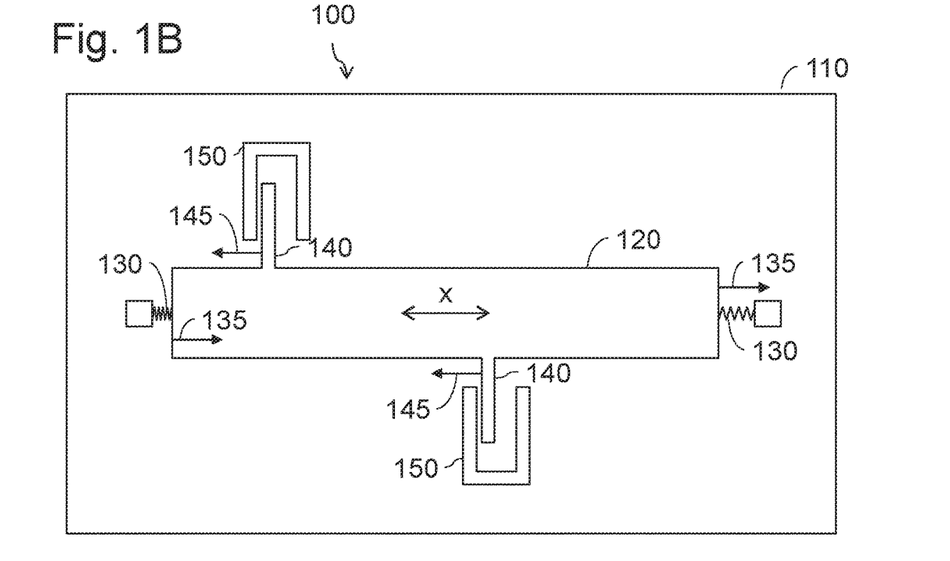

FIGS. 1A and 1B show—in a schematic representation—an acceleration sensor 100 according to an embodiment.

The acceleration sensor 100 includes a substrate 110. A sensor material 120 is mounted by means of spring elements 130 so as to be movable along a movement axis x over the substrate 110. The spring elements 130 are firmly connected to the substrate 110 on a first side of the spring elements 130 and firmly connected to the sensor material 120 on a second side of the spring elements 130. The spring elements 130 allow the sensor material 120 to be deflected along the movement axis x. For example, the spring elements 130 can be formed as flexible bar springs extending perpendicular to the movement axis x and thus allowing a movement solely along the movement axis x, whereas a movement perpendicular to the movement axis x is not possible. However, the spring elements 130 can also have any other form which causes that the sensor material 120 can be deflected along the movement axis x.

First trim electrodes 140 are connected to the sensor material 120. In this process, the first trim electrodes 140 are firmly connected to the sensor material 120, e.g. the sensor material 120 and the first trim electrodes 140 can be formed integrally, i.e. the first trim electrodes 140 are an integral component of the sensor material 120.

Second trim electrodes 150 are connected to the substrate 110 and associated with the first trim electrodes 140. In this process, the second trim electrodes 150 are firmly connected to the substrate 110. For example, the second trim electrodes 150 can be an integral component of the substrate 110.

The pairings of first trim electrodes 140 and second trim electrodes 150 are formed such that, in a rest position of the sensor material 120, no force generated by the first trim electrodes 140 and the second trim electrodes 150 acts on the sensor material 120, since they—as described in more detail below—compensate force components emerging between the trim electrodes 140, 150.

The first trim electrodes 140 and the second trim electrodes 150 need not be mounted symmetrically on the sensor material 120 or the substrate 110. For example, all first trim electrodes 140 can be located on one side of the sensor material 120 or at one end of the sensor material 120.

As depicted in FIG. 1B, the spring elements 130 generate, when deflecting the sensor material 120 along the movement axis x, a spring force 135 which moves the sensor material 120 back into a starting position, in which the forces generated by the individual spring elements 130 compensate, or in which these forces disappear (mechanical zero point). At the same time, by applying an electrical trim voltage between the first trim electrodes 140 and the second trim electrodes 150, an electrostatic force 145 acting on the sensor material 120 is generated which counteracts the spring force 135, as described in the following text.

For example, by applying an electrical trim voltage between the first trim electrodes 140 and the second trim electrodes 150, the first trim electrodes 140 can carry a first charge, e.g. a negative charge, and the second trim electrodes 150 a second charge opposite to the first charge, e.g. a positive charge. This leads to a resulting electrostatic force emerging between the first trim electrodes 140 and the second trim electrodes 150, which increases when the first trim electrodes 140 approach the second trim electrodes 150.

Thus, when deflecting the sensor material 120, a force can be generated which moves the sensor material 120 via the first trim electrodes 140 firmly connected to the sensor material 120 further to the second trim electrodes 150 which are firmly connected to the substrate 110. This electrostatic force 145 is counteracted by the spring force 135 generated by the spring elements 130. Thus, the resulting force on the sensor material 120 is effectively reduced, which corresponds to a reduction of the spring constants of the acceleration sensor 100.

As shown in FIGS. 1A and 1B, the first trim electrodes 140 and the second trim electrodes 150 can be formed such that the electrostatic force 145 is composed of different force components. In FIG. 1B a force component which is greater than the force component emerging between the first trim electrodes 140 and the right-hand sides of the second trim electrodes 150 emerges between the first trim electrodes 140 and the sides of the second trim electrodes 150 which lie closest to the compressed spring elements 130 (in FIG. 1B the left-hand sides of the second trim electrodes). This is the case since a distance between the first trim electrodes 140 and the left-hand sides of the second trim electrodes 150 is smaller than a distance between the first trim electrodes 140 and the right-hand sides of the second trim electrodes 150.

According to further embodiments where the first and second trim electrodes are differently formed, for example, as electrode pairs of a plate capacitor, the second trim electrodes lie closer to the spring elements 130 than the first trim electrodes, in order to generate, when the spring elements 130 are compressed, the electrostatic force 145 counteracting the spring force 135 due to the distance between first and second trim electrodes becoming smaller. Since the sensor material 120 can be moved along the movement axis x in two directions (in FIGS. 1A and 1B to the left-hand side and to the right-hand side), at least two pairs of first and second trim electrodes are then required. The resulting electrostatic force 145 then emerges from the forces between the individual trim electrode pairs.

Therefore, it is possible to freely adjust the spring hardness or stiffness, respectively, of the acceleration sensor 100 via a trim voltage applied between the first trim electrodes 140 and the second trim electrodes 150. Thus, it can be achieved, for example, that the spring force 135 and the electrostatic force 145 are fully compensated, so that, when the sensor material 120 is deflected, there is no longer a resetting force. However, the electrostatic force 145 can also overcompensate, i.e. exceed, the spring force 135, so that, even in the case of a minor deflection of the sensor material 120 only, the electrostatic force 145 increases the sensor material 120 to a large deflection. Since this can lead to immediate overcontrol of the sensor material 120, the acceleration sensor 100 should be operated in this manner only with additional resetting electronics in a closed loop.

Figure 2:
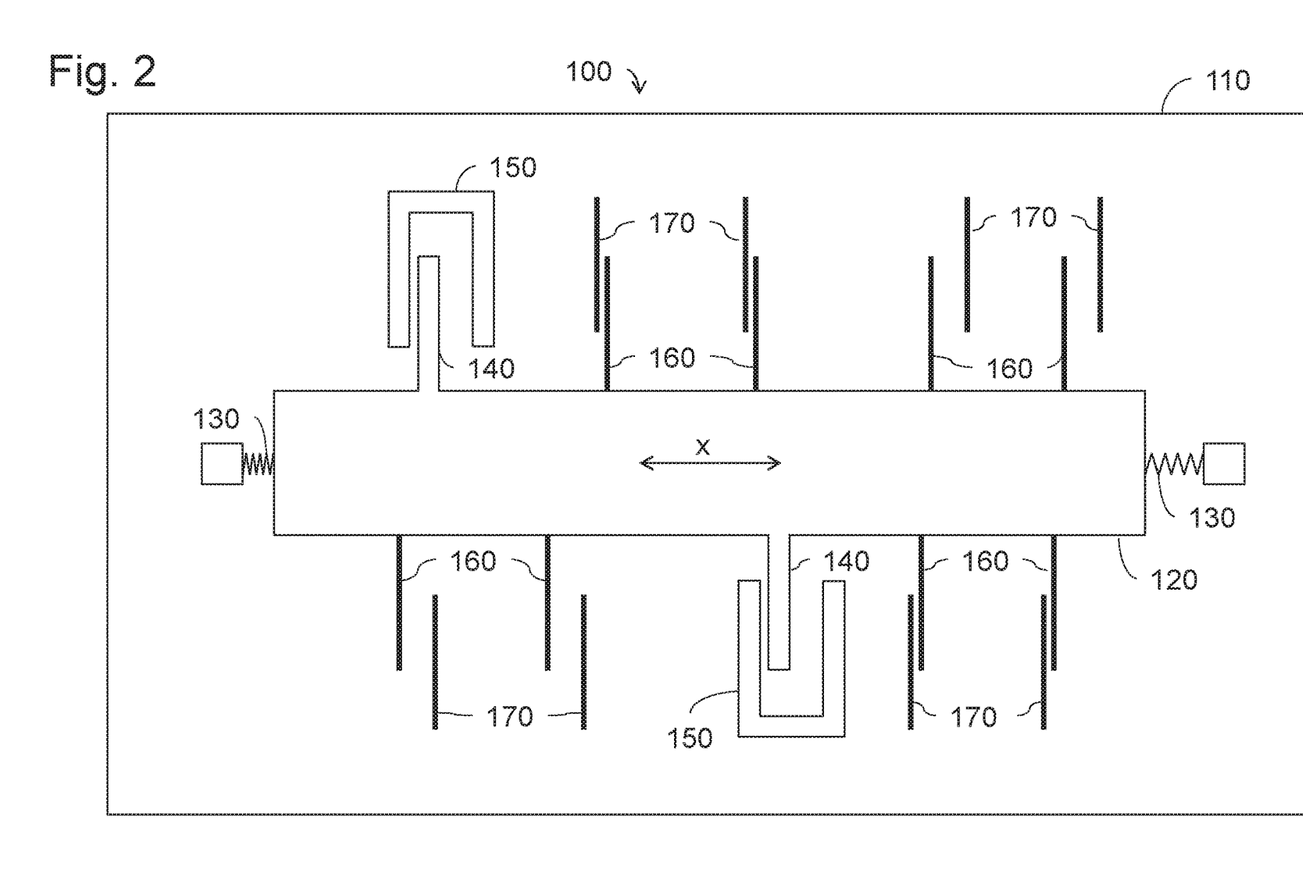
FIG. 2 shows a schematic representation of an acceleration sensor according to another embodiment.

FIG. 2 shows the acceleration sensor 100 with schematically represented sensor electrodes 160 for reading out the acceleration connected to the sensor material 120 and with which schematically represented detection electrodes 170 are associated which are connected to the substrate 110. A voltage between the sensor electrodes 160 and the detection electrodes 170 can be dependent on the deflection of the sensor material 120 along the movement axis x and thus enable to determine the deflection of the sensor material 120. From this deflection, in turn, the acceleration acting on the sensor material 120 can be determined.

After completion of the measurement, the sensor electrodes 160 and the detection electrodes 170 can be used to reset the sensor material 120 again.

However, it is also possible to control the voltage between sensor electrodes 160 and detection electrodes 170 such that the resulting force between sensor electrodes 160 and detection electrodes 170 exactly compensates the acceleration force acting on the sensor material 120 and thus serves for resetting of the sensor material 120. Thus, the sensor material 120 always remains in the same position. The voltage between sensor electrodes 160 and detection electrodes 170 required for position maintenance then serves to determine the acceleration.

The readout of a change in voltage between sensor electrodes 160 and detection electrodes 170 caused by an actual change of position of the sensor material 120, as also shown in FIG. 2, is effected in operation by means of an open loop most of the time, whereas the sensor material 120 is set to a fixed position by means of a closed loop.

According to an embodiment, at least one electrode pair consisting of sensor electrode 160 and detection electrode 170 where, in the case of deflection along the movement axis x, the electrode gap is reduced, and at least one electrode pair where, in the case of the same deflection, the electrode gap is increased, exist. According to another embodiment, a part of the sensor electrodes 160 and of the detection electrodes 170 is used for acceleration measurement, while another part is used to reset the sensor material 120.

The sensor electrodes 160 and the detection electrodes 170 need not be mounted symmetrically on the sensor material 120 or the substrate 110. For example, all sensor electrodes 160 can be located on one side of the sensor material 120 or at one end of the sensor material 120.

If the acceleration sensor 100 is operated by means of a closed loop, then it is advantageous if the position which the sensor material 120 is to take during the measurement is freely determinable. However, due to the spring force generated by the spring elements 130, this is typically not the case, since the system of spring elements 130 and sensor material 120 has a specific mechanical zero point where all spring forces 135 are compensated or reduced to zero. Since, however, the electrostatic force 145, which counteracts the spring force 135 or even fully compensates it, is generated by means of the trim voltage applied between first trim electrodes 140 and second trim electrodes 150, the position of the sensor material 120 in operation can be determined by means of a closed loop far more independently or even completely free of the position of the mechanical zero point. This allows operation of the acceleration sensor 100 in a simpler manner.

In addition, due to the compensation of the spring force 135 by the electrostatic force 145, relative movements of the individual components of the acceleration sensor 100 caused by temperature fluctuations have a less strong influence on the measurement results of the acceleration sensor 100. Due to temperature fluctuations, expansion or contraction of the individual building components of the acceleration sensor 100 can occur. This usually occurs in that the mechanical zero point of the system is displaced, and, in the case of a non-compensated spring force 135, leads to additional distortion of the measurement results of the acceleration sensor 100. Since expansions or contractions due to temperature changes are subject to an effect of hysteresis, different measurement results may occur at the same temperature without a compensating trim voltage. This can be counteracted by a virtually complete compensation of the spring force 135 by the electrostatic force 145, since the system then reacts less or even not at all anymore to a displacement of the mechanical zero point due to temperature fluctuations. Thus, the acceleration sensor 100 becomes more reliable.

Figure 3:
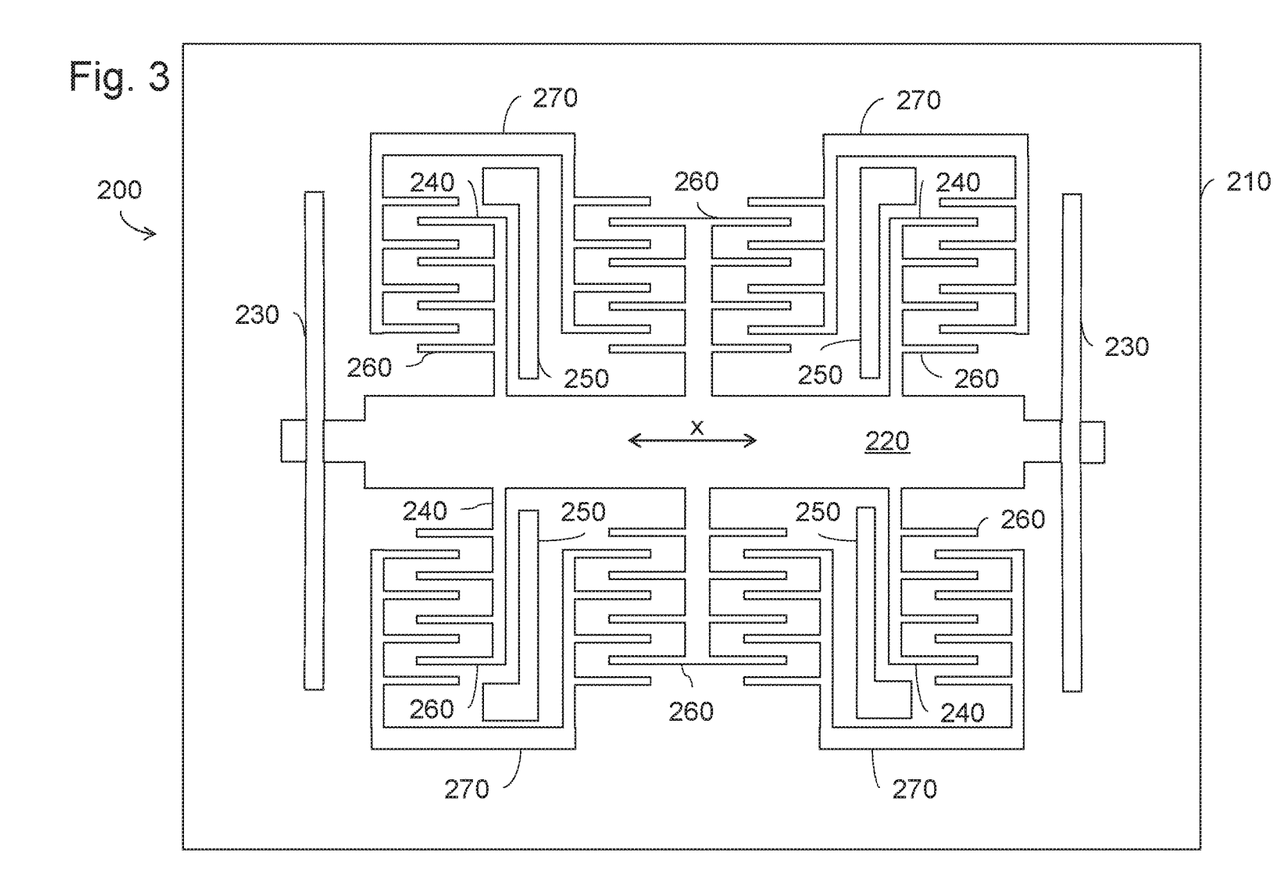
FIG. 3 shows a schematic representation of an acceleration sensor according to another embodiment.

FIG. 3 shows an embodiment of an acceleration sensor 200 as a micro-electro-mechanical system (MEMS) having a substrate 210, a sensor material 220, spring elements 230, first trim electrodes 240, second trim electrodes 250, sensor electrodes 260, and detection electrodes 270.

A part of the sensor electrodes 260 of the acceleration sensor 200 is formed as the first trim electrode 240. In FIG.

3, these are those sensor electrodes 260 which lie closest to the spring elements 230. However, according to further embodiments, also other sensor electrodes 260 can be formed as first trim electrodes 240. In addition, the second trim electrodes 250 are arranged between the sensor electrodes 260 and the detection electrodes 270 such that the trim voltage between the first trim electrodes 240 and the second trim electrodes 250 not only serves for compensation of the spring force generated by the spring elements 230, but also dampens an oscillation of the sensor material 220. Hence, the second trim electrodes 250 serve as damping electrodes at the same time.

A part of the first trim electrodes 240 is formed as comb electrodes, the electrode fingers of which are interlocked with corresponding electrode fingers of the detection electrodes 270. The side of the first trim electrodes 240 facing away from the electrode fingers of the detection electrodes 270 form, together with the second trim electrodes 250 formed as electrode plates, a plate capacitor. Hence, the first trim electrodes 240 serve, with their electrode fingers, as sensor electrodes 260 and with their backsides as a counter plate to the electrode plates of the second trim electrodes 250. Thus, it is possible to assign a plurality of tasks to individual electrodes of the acceleration sensor 200. Hence, the first trim electrodes 240 serve both for detection of the acceleration present on the acceleration sensor 200 and for adjusting the spring stiffness of the acceleration sensor 200. The second trim electrodes 250 serve both for damping of the oscillation of the sensor material 120 triggered by the acceleration of the acceleration sensor 200 and for adjusting the spring stiffness of the acceleration sensor. Thus, it is possible to reduce the number of components required for operating the acceleration sensor 200 to a minimum and be able to design the acceleration sensor 200 in a compact and cost-efficient manner.

Figure 4:
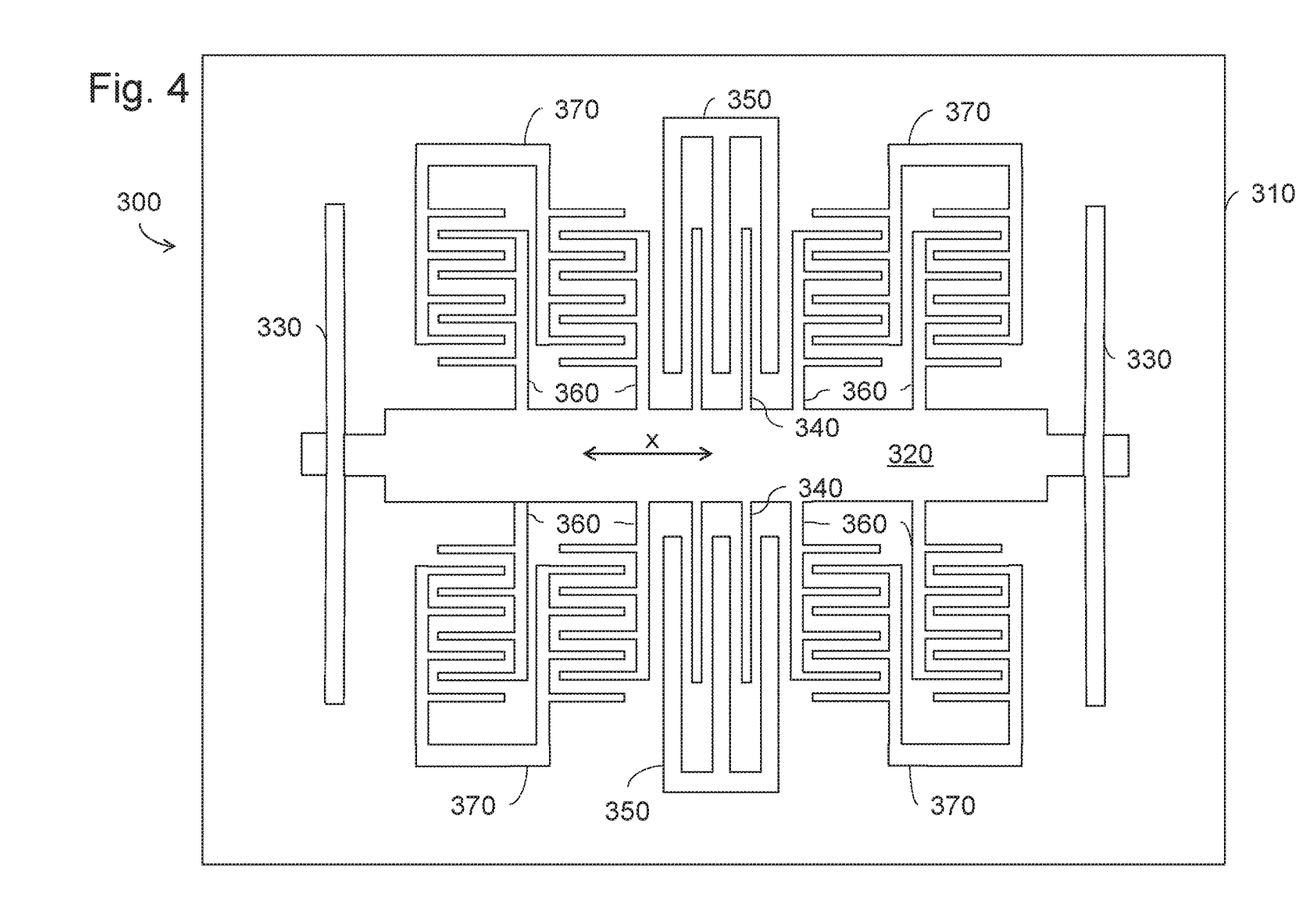
FIG. 4 shows a schematic representation of an acceleration sensor according to another embodiment.

According to another embodiment of an MEMS acceleration sensor 300 shown in FIG. 4, it is possible to separate the readout of acceleration from the adjustment of the spring hardness. To this end, the acceleration sensor 300 has a substrate 310, a sensor material 320, spring elements 330, first trim electrodes 340, second trim electrodes 350, sensor electrodes 360, and detection electrodes 370.

The first trim electrodes 340 are mounted symmetrically to an axis of symmetry perpendicular to the movement axis x on the sensor material, and the second trim electrodes are mounted symmetrically to the same axis of symmetry perpendicular to the movement axis x on the substrate. As depicted in FIG. 4, the sensor electrodes 360 and the detection electrodes 370 can be arranged separately from the first trim electrodes 340 and the second trim electrodes 350.

Due to the symmetrical design of the first trim electrodes 340 and of the second trim electrodes 350 it is ensured that the electrode gap between the trim electrodes 340, 350 can be designed completely symmetrically, whereby no resulting force acting on the sensor material 320 is created as long as it is not deflected. Due to the concentration of trim electrodes 340, 350 at a certain spot of the sensor material 320, e.g. in the center of the sensor material 320, the effect of manufacturing tolerances can be additionally reduced.

In addition, it is possible to integrate damping electrodes, as depicted by the second trim electrodes 250 in FIG. 3, separately into the acceleration sensor 300 of FIG. 4. This enables ability to achieve high flexibility for the control, damping, readout and trimming of the acceleration sensor 300 by means of readout, damping and trim voltages individually settable in each case.

The trim electrodes 340, 350 shown in FIG. 4 are formed as electrode plates and form plate capacitors. This allows the manufacture of the acceleration sensor 300 in a simple and cost-efficient manner. According to further embodiments, the first and second trim electrodes 340, 350 formed as plate capacitors can also be mounted at another spot on the sensor material 320, e.g. at the edge of the sensor material 320, on only one side of the sensor material 320, or at any arbitrary spot of the sensor material 320.

Figure 5:
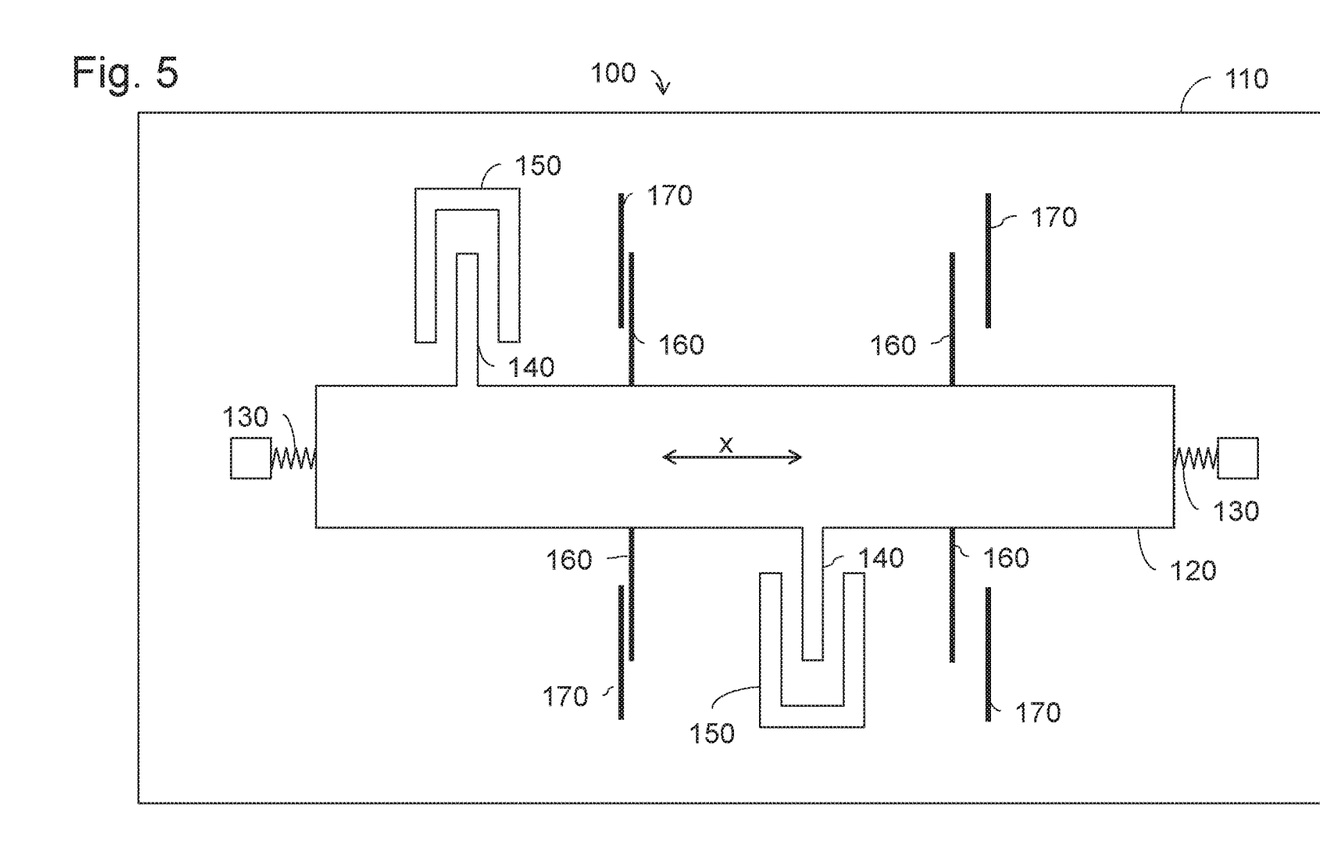
FIG. 5 shows a schematic representation of the development of a measurement distortion (bias) in an acceleration sensor according to an embodiment.

FIG. 5 shows the acceleration sensor 100 in the case where a mechanical rest position of the sensor material 120 differs from the electrical rest position (i.e. the position of the sensor material 120 without resulting force from sensor electrodes 160 and detection electrodes 170) of the sensor material 120, e.g. due to manufacturing tolerances. In addition to the mechanical rest position and the electrical rest position, also a trim rest position exists where no forces between the first trim electrodes 140 and the second trim electrodes 150 act, or where acting forces are compensated, respectively. In the text below it is assumed for reasons of simplification that the mechanical rest position corresponds to the trim rest position.

As schematically represented in FIG. 5 through the same length of the spring elements 130 and the central position of the first trim electrodes 140 between the second trim electrodes 150, the sensor material 120 is in the mechanical rest position (or the trim rest position, respectively) where no force along the movement axis x is exerted on the sensor material 120 by the spring elements 130 and the first and second trim electrodes 140, 150.

However, due to manufacturing tolerances, the case often occurs that this mechanical rest position differs from the electrical rest position determined by the positions of the sensor electrodes 160 and of the detection electrodes 170. This is schematically represented in FIG. 5 through different distances between sensor electrodes 160 and detection electrodes 170. The sensor electrodes 160 and the detection electrodes 170 are depicted as simple electrode plates in FIG. 5. However, according to further embodiments, they can also have the form of comb electrodes, as shown in FIGS. 2 and 3, or be a mix of comb electrodes and electrode plates.

Hence, although the sensor material 120 is mechanically at rest, readout electronics conclude from the relative position of the sensor electrodes 160 to the detection electrodes 170 that an acceleration along the movement axis x is already present. This usually leads to a distortion (bias) of the measurement results, which must be corrected if exact measurements are to be achieved.

As already explained above, the sensor material 120 is kept in a specific position when the acceleration sensor 100 is operated by means of a closed loop. By reducing the spring hardness of the entire acceleration system by means of the trim voltage applied between the first and second trim electrodes 140, 150, this position can be chosen more freely and, for example, be set such that the measurement system of sensor electrodes 160 and detection electrodes 170 cannot detect any displacement of the sensor material 120, i.e. the acceleration sensor 100 can, for example, be operated at the electrical zero point.

However, according to another embodiment it is also possible to operate the acceleration sensor 100 with the sensor material 120 in the trim rest position. This is also possible, when the mechanical rest position—for example, due to manufacturing tolerances—is not consistent with the trim rest position. By means of a closed loop as described above, a reset force is generated by the sensor electrodes 160 and the detection electrodes 170 which keeps the sensor material in the trim rest position. The amount of deviation to the electrical rest position is then calculated electronically in order to obtain correct measurement results.

On the other hand, it is possible to change the position of the sensor material 120 via a voltage applied between the sensor electrodes 160 and the detection electrodes 120 such that it is kept in a neutral position in which the acceleration required for further deflection is independent of the trim voltage. This position is typically consistent with the mechanical zero point. The neutral position and the corresponding acceleration together form a characteristic parameter pair with the aid of which the functionality of the acceleration sensor 100 can be checked. In particular, the deviation of the mechanical zero point from the electrical zero point can be determined by means of a calculating unit, and thus the distortion of the measurement results, i.e. the bias, can be determined and compensated for.

Figure 6:
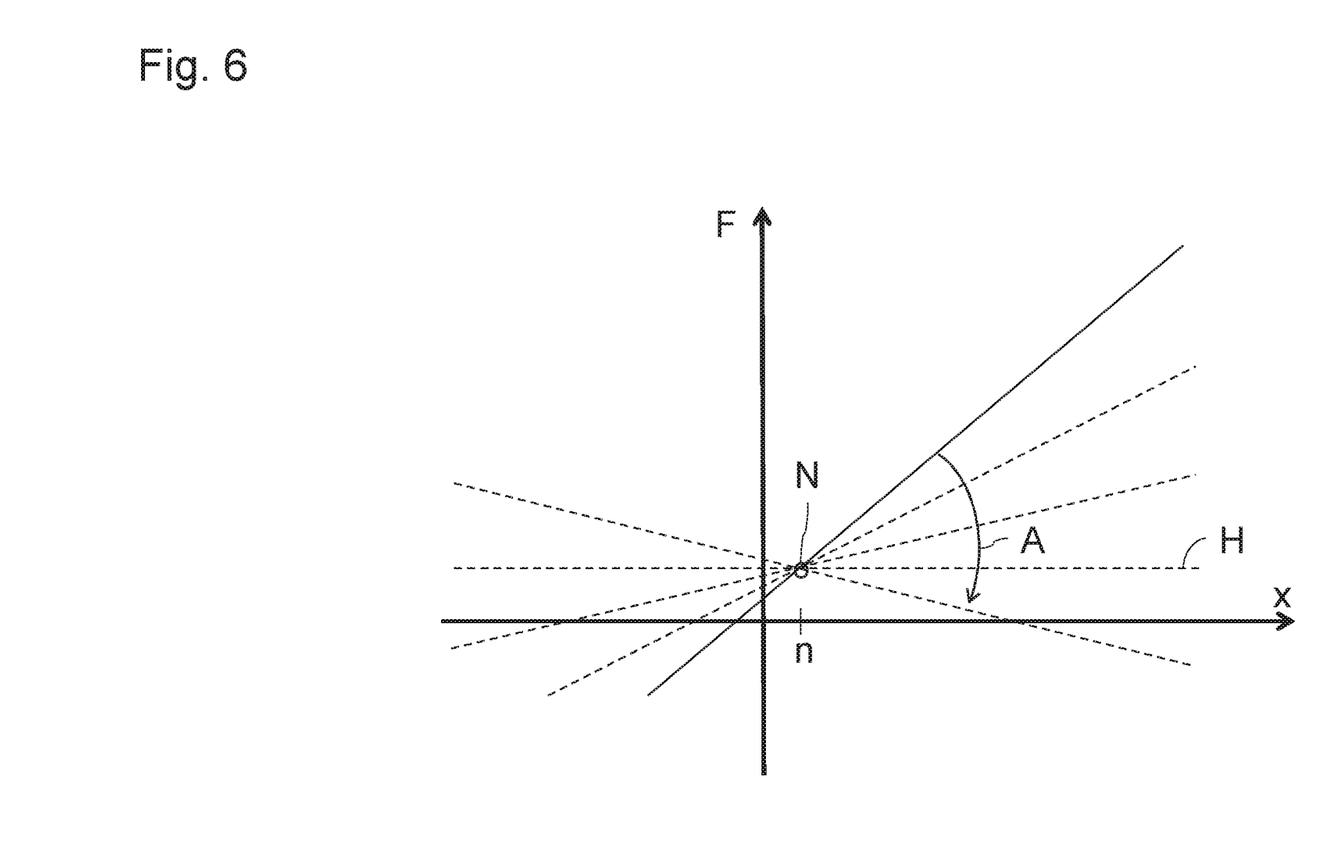
FIG. 6 shows a schematic representation of the dependency of a spring stiffness of an acceleration sensor at different trim voltages as a parameter.

This, for example, is possible based on the diagram depicted in FIG. 6. FIG. 6 shows the dependency of the force F required for deflecting the sensor material 120 on location x in dependency of the trim voltage for small deflections. If no trim voltage is applied, then a dependency relationship emerges according to the solid line. By increasing the trim voltage, this line is rotated around a neural point N along the movement of the arrow A, which is indicated by the dashed lines. At a specific trim voltage, the generated electrostatic force 145 fully compensates the spring force 135, whereby the force F required for deflection becomes independent of the location x (dashed horizontal line H in FIG. 6).

The neutral point N, the x coordinate of which corresponds to the neutral position, can now be used for the determination of the bias. Since the amount of force F needed and the location x are determined with reference to the readout system of the sensor electrodes 160 and detection electrodes 170, the displacement between mechanical zero point and electrical zero point exactly corresponds to the x value of N. Thus, the determination or control of the bias is possible through the detection of the neutral point N.

In addition, the acceleration sensor 100 can be checked for errors by means of the neutral point N. To this end, the neutral point N is initially determined when the acceleration sensor is commissioned. If the position of the neutral point N changes horizontally, this means that the electrode structure has changed, i.e. the position or form of the trim electrodes 140, 150 is unstable, or the electrical rest position of the sensor and detection electrodes has changed. However, if the position of the neutral point N changes in the vertical direction, then the electrode structure (trim electrodes 140, 150, sensor electrodes 160, detection electrodes 170) is stable. Therefore, a change based on mechanical forces is given which, for example, has caused a displacement in the crystal structure of the materials used for the acceleration sensor 100.

Thus, it is not only possible for an acceleration sensor according to the invention to freely adjust the spring hardness or stiffness of the acceleration sensor. Due to this free adjustability, important parameters for the operation of the acceleration sensor, such as the position of the neutral point N, can be determined and the reliability of the acceleration sensor increased.

The invention claimed is:

1. An acceleration sensor comprising:
a sensor material which is mounted by means of spring elements so as to be movable along a movement axis (x) over a substrate
first trim electrodes which are connected to the sensor material, the first trim electrodes including comb electrodes comprised of electrode fingers and a region from which the electrode fingers extend; and
second trim electrodes formed as electrode plates and which are connected to the substrate and are associated with the first trim electrodes, wherein
when the sensor material is deflected along the movement axis (x), a spring force acting on the sensor material is generated by the spring elements;
when the sensor material is deflected, an electrostatic force acting on the sensor material, which counteracts the spring force, is generated by application of an electrical trim voltage between the first trim electrodes and the second trim electrodes,
wherein a side of the region from which the electrode fingers extend forms plate capacitors with the associated second trim electrodes where the plate capacitors generate the electrostatic force.

2. The acceleration sensor according to claim 1 comprising:
sensor electrodes which are connected to the sensor material; and
detection electrodes which are connected to the substrate and are associated with the sensor electrodes, wherein
a deflection of the sensor material along the movement axis (x) can be determined through a change of an electrical detection voltage between or of an electrical charge on the sensor electrodes and the associated detection electrodes.

3. The acceleration sensor according to claim 2, wherein
a part of the sensor electrodes is formed as the first trim electrodes; and wherein
the trim voltage between the sensor electrodes formed as the first trim electrodes and the second trim electrodes dampens the deflection of the sensor material.

4. The acceleration sensor according to claim 1, wherein
the first trim electrodes are arranged symmetrically to a plane of symmetry perpendicular to the movement axis (x) on the sensor material; and wherein
the second trim electrodes are arranged symmetrically to the axis of symmetry perpendicular to the movement axis (x) on the substrate.

5. The acceleration sensor according to claim 1, wherein
the electrostatic force generated by the first trim electrodes and the second trim electrodes is equal to the spring force generated by the spring elements.

6. The acceleration sensor according claim 1, wherein
a part of the first trim electrodes is formed as electrode plates; and wherein
the first trim electrodes, which are formed as electrode plates, and the associated second trim electrodes form plate capacitors.

7. The acceleration sensor according to claim 2, wherein
the sensor material, through setting of the detection voltage, is kept in a neutral position in which the acceleration required for further deflection is independent of the trim voltage.

8. The acceleration sensor according to claim 7, wherein
a computing unit determines, from a neutral position, a deviation of a first position of the sensor material in which no spring force acts on the sensor material, from a second position of the sensor material in which no force generated by the sensor electrodes and the detection electrodes acts on the sensor material.

9. The acceleration sensor according to claim 7, wherein a computing unit, based on changes of a neutral position and changes of the trim voltage required to cancel the spring force, checks the acceleration sensor for errors.

10. The acceleration sensor according to claim 1, wherein the acceleration sensor is a micro-electro-mechanical system.

\* \* \* \* \*